United States Patent
Kurumatani et al.

(10) Patent No.: US 6,426,310 B1
(45) Date of Patent: Jul. 30, 2002

(54) ELECTRICALLY INSULATING NON-WOVEN FABRIC, A PREPREG AND A LAMINATE

(75) Inventors: Shigeru Kurumatani; Hirokazu Hiraoka; Masayuki Noda, all of Hikone; Tomoyuki Terao; Setsuo Toyoshima, both of Tokyo; Yoshihisa Kato; Hiroyoshi Ueno, both of Nakatsugawa, all of (JP)

(73) Assignees: Shin-Kobe Electric Machinery Co., Ltd.; Oji Paper Co., Ltd., both of Tokyo (JP)

( * ) Notice: Subject to any disclaimer, the term of this patent is extended or adjusted under 35 U.S.C. 154(b) by 0 days.

(21) Appl. No.: 09/405,037

(22) Filed: Sep. 24, 1999

(30) Foreign Application Priority Data

Sep. 28, 1998 (JP) ............................................. 10-272365

(51) Int. Cl.[7] .......................... D04H 1/40; D04H 1/54; D04H 1/58
(52) U.S. Cl. ...................... 442/415; 442/117; 442/411; 442/414; 428/901
(58) Field of Search ................................ 442/415, 409, 442/411, 414, 117; 428/901

(56) References Cited

U.S. PATENT DOCUMENTS 5,948,543 A * 9/1999 Ootuka et al. ............... 442/415
6,280,843 B1 * 8/2001 Murayama et al. .......... 428/408

FOREIGN PATENT DOCUMENTS

| EP | 0 790 341 | 8/1997 | ............ D04H/1/42 |
| EP | 0 962 559 | 12/1999 | ............ D01F/6/60 |
| WO | WO 94/23553 | 10/1994 | ............ H05K/1/03 |

OTHER PUBLICATIONS

Patent Abstracts of Japan, vol. 1999, No. 09, Jul. 30, 1999 & JP 11 117184 A (Oji Paper Co. Ltd.) Apr. 27, 1999.

* cited by examiner

Primary Examiner—Terrel Morris
Assistant Examiner—Jenna-Leigh Befumo
(74) Attorney, Agent, or Firm—Pearne & Gordon LLP

(57) ABSTRACT

A non-woven fabric comprising a principal component of para-aramid fiber chops bonded with each other by a binder, the para-aramid fiber chops having a mixture of (a) poly-p-phenylene-3,4'-diphenylether-terephthalamide fibers and (b) poly-p-phenylene-terephthalamide fibers and having a blend ratio by weight of (a)/(b)=10/90~90/10 and preferably (a)/(b)=30/70~70/30.

9 Claims, 1 Drawing Sheet

ELECTRICALLY INSULATING NON-WOVEN FABRIC, A PREPREG AND A LAMINATE

BACKGROUND OF THE INVENTION

This invention pertains to an electrically insulating non-woven fabric comprising an aromatic polyamide fiber (aramid fiber) non-woven fabric, a prepreg and a laminate having the aforementioned electrically insulating non-woven fabric as base material and including a printed wiring board and a multi-layer printed wiring board as a concept on which leadless chip parts such as resistors, ICs and so on are surface-mounted.

Of late, in case that electronic parts such as resistors, ICs and so on are mounted on a printed wiring board which is assembled in an electronic device or instrument, the electronic parts have generally tended to be chipped and mounted on the printed wiring board by a surface-mount system. The surface-mount system is a preferable one because the electronic parts are compacted and lightened and have a high density. As the printed wiring board has the high density, it tends to be generally worked by an IVH (which stands for an inner via hole not extending through an entire multilayer insulation, but partially extending through the insulation) process in which a laser light is irradiated on the printed wiring board in order to connect electrically conducting wires to each other through an IVH provided in an insulating layer disposed between the electrically conducting wires among the multilayer insulation. Thus, the printed wiring board is required to be easily worked by the laser process.

In case that the leadless chip parts are surface-mounted on the printed wiring board, the printed wiring board should have a coefficient of thermal expansion matched to that (2~7 ppm/° C.) of the leadless chip parts as much as possible.

The printed wiring board is desired to have a smaller ratio of size variation due to thermal shrinkage for improving a reliance on connection of the electrically conducting wires between which the insulating layer is provided. Particularly, the multi-layer printed wiring board makes much of the smaller ratio of size variation.

In view of this, there have been developed various laminates having base material formed of non-woven fabrics of aramid fibers having a negative coefficient of thermal expansion. These non-woven fabrics are as follows;

(1) a mixed non-woven fabric of para-aramid fiber chops such as poly-p-phenylene-3,4'-diphenylether-terephthalamide fiber chops and thermoplastic resin fiber chops having a softening temperature of 220° C. or higher and these fibers being bonded by a resin binder while the thermoplastic resin fiber chops having the softening temperature of 220° C. or higher are thermally adhered to the para-aramid fiber chops which is disclosed in JP 10-138381.

(2) a mixed non-woven fabric of para-aramid fiber chops such as poly-p-phenylene-terephthalamide fiber chops, para-aramid fiber pulps and meta-aramid fibrids and the para-aramid fiber pulps and the meta-aramid fibrids being intertwined with the para-aramid fiber chops which is disclosed in JP61-160500.

Prepregs are produced by impregnating the non-woven fabrics with a thermosetting resin and drying them. The thus produced prepregs are heated and pressed to form a laminate. Generally, a metal foil or foils to be worked for forming printed wirings are provided integrally with the prepregs when they are formed under heat and pressure so as to form a metal foil clad laminate.

Poly-p-phenylene-3,4'-diphenylether-terephthalamide fibers which are one kind of the para-aramid fibers should be drawn for improving a strength of fibers when spinning them, but the drawn fibers tend to be shrunk due to heat applied thereto. Thus, the printed wiring board having the base insulation material of the non-woven fabrics including poly-p-phenylene-3,4'-diphenylether-terephthalamide fibers as a principal component tends to have a higher size variation or be thermally shrunk in high degree when solder reflows. Such a printed wiring board should be more improved in a reliance on connection of printed wirings through the insulating layer as well as connection of the surface-mounted parts to each other.

Poly-p-phenylene-terephthalamide fibers which are another kind of the para-aramid fibers have a very high crystallinity because they are crystally spun and therefore have a high bond between molecules. However, the printed wiring board having the base insulation material of the non-woven fabrics including poly-p-phenylene-terephthalamide fibers as a principal component tends to have a lower hole making operation by a laser irradiation process. As a matter of course, prepregs produced by impregnating the non-woven fabrics with a thermosetting resin and drying them also have a lower hole making operation by a laser irradiation process.

More particularly, when a prepreg formed of the non-woven fabric including poly-p-phenylene-terephthalamide fibers and a laminate formed of the thus produced prepregs are worked by a hole-making operation by the laser process to form holes, they have a large dispersion or scattering in the resultant hole diameter. This is caused by the low degree in which aramid fibers are discomposed and scattered by the irradiation of the laser. These fibers have little shrinkage due to heat because they are spun in a crystalline manner, but not in a drawn manner.

SUMMARY OF THE INVENTION

Accordingly, it is a principal object of the invention to provide an electrically insulating non-woven fabric having para-aramid fibers as a principal component suitable for forming a prepreg or a laminate including a printed wiring board adapted to have a good hole-making operation by a laser process while it has little dispersion in hole diameter.

It is another object of the invention to provide an electrically insulating non-woven fabric having para-aramid fibers as a principal component suitable for forming a laminate including a printed wiring board adapted to provide no dispersion in size variation due to heat applied to the laminate.

It is further object of the invention to provide a prepreg comprising as a base material a non-woven fabric having para-aramid fibers as a principal component adapted to have a good hole-making operation by a laser process while it has little dispersion in hole diameter.

It is further object of the invention to provide a laminate formed of prepregs comprising as a base material a non-woven fabric having para-aramid fibers as a principal component adapted to have a good hole-making operation by a laser process while it has little dispersion in hole diameter and adapted to have little dispersion in size variation due to heat.

In accordance with a first aspect of the invention, there is provided an electrically insulating non-woven fabric comprising para-aramid fiber chops bonded with each other by a binder, the non-woven fabric characterized by the para-aramid fiber chops having a mixture of poly-p-phenylenediphenylether-terephthalamide fibers and poly-p-phenylene-terephthalamide fibers with a blend ratio by weight of poly-p-phenylene-diphenylether-terephthalamide fibers relative to poly-p-phenylene-terephthalamide fibers ranging from 10/90 to 90/10.

The poly-p-phenylene-diphenylether-terephthalamide fibers may be specifically poly-p-phenylene-3,4'-diphenylether-terephthalamide fibers.

The blend ratio by weight of poly-p-phenylene-diphenylether-terephthalamide fibers relative to poly-p-phenylene-terephthalamide fibers may preferably range from 30/70 to 70/30.

The binder serving to bond the fibers to each other may be selectively a thermosetting resin binder or a thermoplastic resin having a softening temperature of 220° C. or higher. Otherwise, both of them may be used as the binder. The thermosetting resin binder bonds the fibers to each other by being attached to the fibers at their intersections. The thermoplastic resin having the softening temperature of 220° C. or higher bonds the fibers to each other by being thermally adhered to and/or being intertwined with the para-aramid fiber chops.

The thermoplastic resin having the softening temperature of 220° C. or higher may be in the form of at least one selected from chops, fibrids and pulps.

The chops are formed by cutting straight fibers into ones having predetermined size suitable for paper making. The "fibrids" are small non-granular, non-rigid fibrous or film like particles, as defined in U.S. Pat. Nos. 4,698,267 and 4,729,921. The fibrids may be formed by beating a film-like resin or may be NOMEX fibrids commercially available from Du Pont or CONEX fibrids commercially available from Teijin, Japan. The pulps are formed by beating fibers.

The chops can be intertwined with each other by being deformed due to thermal adhesion or thermal softening so that the fibers can be bonded to each other. The fibrids and the pulps themselves functions to be intertwined with each other. Thus, the fibers can be bonded to each other by paper making them together with para-aramid fiber chops. They can be more strongly intertwined with each other by deformation due to thermal adhesion or thermal softening by appropriately applying heat thereto. Para-aramid fiber pulps may be blended as an auxiliary component of the binder.

With the poly-p-phenylene-diphenylether-terephthalamide fibers and the poly-p-phenylene-terephthalamide fibers in combination used as the para-aramid fiber chops, the poly-p-phenylene-terephthalamide fibers serve to restrain the size variation due to heat applied thereto. Since all the para-aramid fiber chops are not just the poly-p-phenylene-terephthalamide fibers, the products are allowed to be worked by the laser process.

In general, the non-woven fabric tends to have high or low fiber density locations.

More particularly, it has areas where more fiber is present and other areas where less fiber is present. A hole diameter formed by the laser process varies in accordance with the fiber density. As the blend ratio increases of poly-p-phenylene-diphenylether-terephthalamide fibers which have poor working properties by the laser process, the fiber density of the non-woven fabric greatly influences hole-making, which causes a dispersion in the hole diameter to vary in accordance with the hole location in the non-woven fabric.

With the blend ratio of poly-p-phenylene-terephthalamide fibers being 90 or less while that of poly-p-phenylene-diphenylether-terephthalamide fibers is 10 or more, the dispersion in the hole diameter gets smaller.

With the blend ratio of poly-p-phenylene-diphenylether-terephthalamide fibers being 90 or less while that of poly-p-phenylene-terephthalamide fibers is 10 or more, a dispersion in the size variation due to heat gets smaller and the reliance in the IVH and the part surface-mount is improved.

Thus, it will be noted that both of the characteristics with respect to the dispersion in the hole diameter in the hole-making operation by the laser process and the dispersion in the size variation due to heat can be improved by the blend ratio by weight of the two para-aramid fibers ranging from 10/90 to 90/10 so that no special care is taken of the laser process and the solder reflowing. The blend ratio by weight of the former relative to latter ranging from 30/70 to 70/30 can make less dispersions in the hole diameter by the laser process and in the size variation due to heat and also less size variation itself due the heat.

The prepregs according to the invention are formed by impregnating the electrically insulating non-woven fabrics with a thermosetting resin and drying them and the electrically non-woven fabrics include at least one constructed in accordance with the invention as aforementioned.

The laminate according to the invention is formed by forming a layer or layers of the prepreg under heat and pressure and the layer or layers of the prepreg include at least one constructed in accordance with the invention as aforementioned.

BRIEF DESCRIPTION OF THE DRAWING

The aforementioned and other features of the invention will be apparent from the embodiments of the invention taken along with examples with reference to the accompanying drawing in which.

Figure 1:
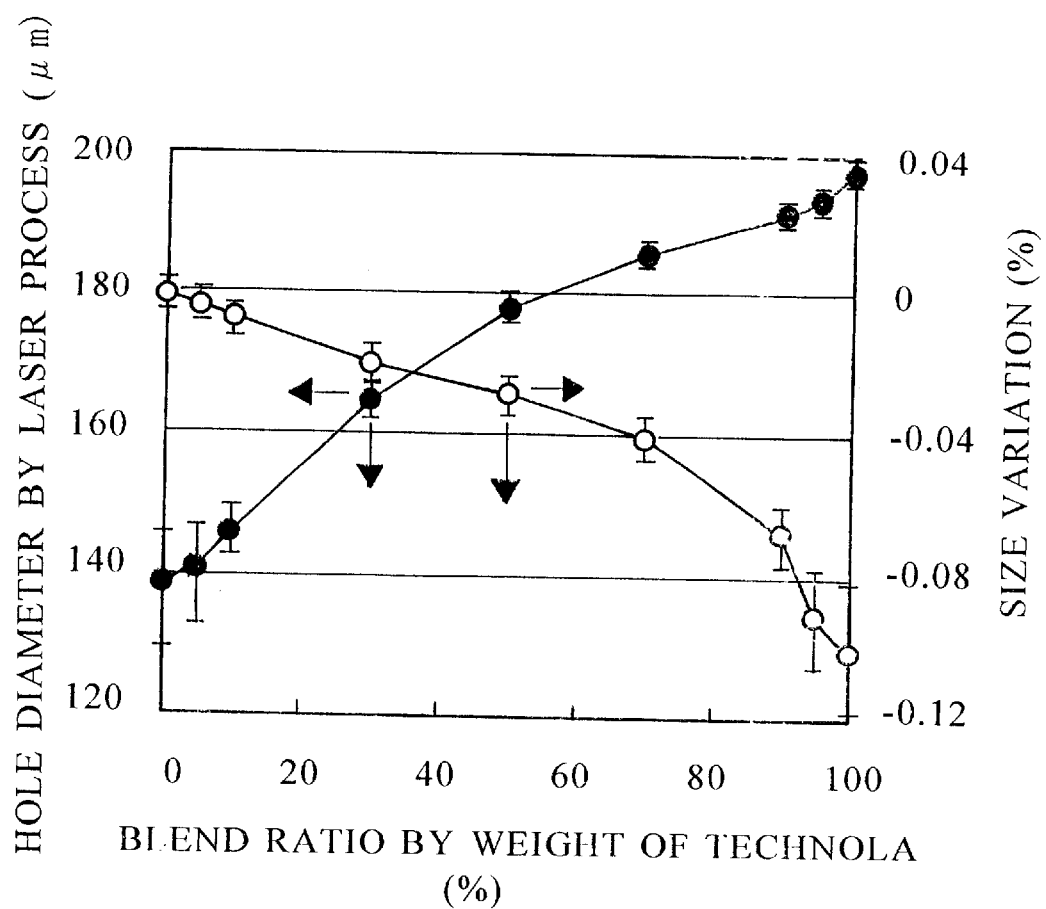
FIG. 1 illustrates variation in a diameter of hole formed in various prepregs by a laser process together with an average as well as a dispersion thereof and also illustrates size variation of various printed wire boards together with an average as well as a dispersion thereof.

DETAILED DESCRIPTION OF EMBODIMENTS
OF THE INVENTION

Initially, an example of an electrically insulating non-woven fabric of the invention will be described herein just below.

In this example, a thermosetting resin binder and a thermoplastic resin having a softening temperature of 220° C. or higher are used in combination as a binder for bonding the para-aramid fiber chops preferably having a fiber diameter of 1.5 denier or less and a fiber length of 6 mm and less.

The thermosetting resin binder serves to bond the fibers to each other by being attached to the fibers at their intersections. The thermoplastic resin fiber chops serve to bond the fibers to each other by being thermally adhered to the para-aramid fiber chops. Otherwise, the thermoplastic resin fiber chops serve to bond the fibers to each other by being thermally softened and deformed so that they are intertwined with the para-aramid fiber chops. These intertwining by thermal adhesion and softening can be accomplished by introducing the non-woven fabric into a step of pressing it between thermal rolls (heated rolls).

A content of the thermosetting resin binder in the non-woven fabric may be 5 to 30 weight % and may be preferably 5 to 15 weight %.

As the content of the thermosetting resin binder decreases, the fibers are more loosely bonded to each other. The content of 5 weight % is the minimum value to be considered in view of previously giving the non-woven fabric a positively bonding strength when the non-woven fabric is introduced into the thermal adhesion step conducted by the thermal rolls. The content of 30 weight % is the maximum value to be considered because the fibers tend to stick to the heated rolls and/or the non-woven fabric tends to be broken as the content exceeds 30 weight %.

The content of the thermoplastic resin fiber chops having the softening temperature of 220° C. or higher in the non-woven fabric may be preferably higher because they serve to positively bond the fibers to each other and to prevent the non-woven fabric from being warped and/or twisted, but may be lower in view of a heat resistance of the laminate. Preferably, the content of the thermoplastic resin fiber chops is 5 to 30 weight %.

The thermoplastic resin fiber chops having the softening temperature of 220° C. or higher may be formed of meta-aramid fibers such as poly-m-phenylene-isophthalamide fibers, polyester fibers, 6 nylon fibers, 66 nylon fibers, poly-allylate fibers and so on, but not limited thereto so long as they are thermoplastic resin fibers having the softening temperature of 220° C. or higher. The softening temperature of the thermoplastic resin fiber should be a thermal decomposition temperature or less of the para-aramid fibers.

The thermoplastic resin fibers having the softening temperature of 220° C. or higher may be preferably not drawn. The concept of the thermoplastic resin fibers not drawn includes those drawn in small degree. With the thermoplastic resin fibers having the softening temperature of 220° C. or higher being not drawn, the fibers can be thermally adhered to each other or intertwined with each other by the thermal rolls in an easier manner.

The thermoplastic resin having the softening temperature of 220° C. or higher may be in the form of at least one selected from fiber chops, fibrids and pulps. With the fiber chops used, the paper-made non-woven fabric has larger voids, which causes the non-woven fabric to be more easily impregnated with a resin impregnant for producing the laminate. The selection of the fiber chops is desirable for improving the humidity resistance and the electrical insulation of the laminate.

In case that the meta-aramid fiber chops are selected as the thermoplastic resin having the softening temperature of 220° C. or higher, they may desirably have the fiber diameter of 3 denier or less and the fiber length of 3 to 10 mm. The fiber length of the meta-aramid fiber should be larger in order to provide more areas where the meta-aramid fibers are thermally adhered to each other or intertwined with each other by being thermally softened, but it should be smaller in order to provide better dispersion of the fibers on paper-making. Thus, it should be adjusted in an appropriate manner.

The laminate of the invention is produced by using the aforementioned non-woven fabrics as a base material. For the first time, the non-woven fabrics are impregnated with an epoxy resin varnish and dried to form prepregs. Next, one prepreg or a plurality of prepregs superposed one on another are formed under heat and pressure. Generally, a metal foil or foils are superposed on one surface or both surfaces of the prepregs before the prepregs are formed under heat and pressure to form a metal clad laminate.

The printed wiring board is produced by wiring the metal clad laminate by etching the metal foil or foils thereof. The multi-layer printed wiring board can be produced by using a plurality of prepreg layers. At least one of the prepregs should be produced as aforementioned.

EXAMPLE 1

1. Production of the Electrically Insulating Non-woven Fabric

There were prepared para-aramid fiber chops formed of poly-p-phenylene-3,4'-diphenylether-terephthalamide fibers commercially available as the tradename of TECHNOLA from TEIJIN CO., LTD., Japan and poly-p-phenylene-terephthalamide fibers commercially available as the tradename of KEVLAR from Du Pont, both of which have a fiber diameter of 1.5 denier and a fiber length of 3 mm. The blend ratio by weight of TECHNOLA/KEVLAR was 10/90.

There was used a binder of a thermosetting resin binder of a water-soluble epoxy resin having a glass transfer temperature of 110° C. and meta-aramid fiber chops not drawn having a fiber diameter of 3 denier, a fiber length of 6 mm and a softening temperature of 280° C. in combination.

The para-aramid fiber chops and the meta-aramid fiber chops were dispersed in water and paper-made. After the thermosetting resin binder was sprayed upon the paper-made product, it was heated and dried to form the non-woven fabric. The non-woven fabric was compressed under heat by passing between a pair of thermal rolls having a linear pressure of 200 kgf/cm and a temperature of 333° C.

The thus produced aramid fiber non-woven fabric had a unit weight of 72 g/m$^2$ and a component of the para-aramid fiber chops of 77 weight %, the meta-aramid fiber chops of 15 weight % and the thermosetting resin binder of 8 weight %. The meta-aramid fiber chops were thermally adhered to the para-aramid fiber chops.

2. Production of the Prepregs

The prepergs were produced by impregnating the aforementioned aramid fiber non-woven fabric base material with brominated bisphenol A-type epoxy resin varnish and drying them. The thus produced prepreg had a resin content of 52 weight %.

3. Production of the Laminate

The four prepregs produced as aforementioned were superposed one upon another and upper and lower copper foils having a thickness of 18 μm mounted thereon. They were formed under a temperature of 170° C. heat and under pressure of 40 kgf/cm$^2$ to obtain the copper foil clad laminate.

EXAMPLE 2

There were produced the aramid fiber non-woven fabrics, the prepregs and the copper clad laminates in the same manner as those of Example 1 except that the blend ratio by weight of TECHNOLA/KEVLAR in the para-aramid fiber chops was 30/70.

EXAMPLE 3

There were produced the aramid fiber non-woven fabrics, the prepregs and the copper clad laminates in the same manner as those of Example 1 except that the blend ratio by weight of TECHNOLA/KEVLAR in the para-aramid fiber chops was 50/50.

EXAMPLE 4

There were produced the aramid fiber non-woven fabrics, the prepregs and the copper clad laminates in the same manner as those of Example 1 except that the blend ratio by weight of TECHNOLA/KEVLAR in the para-aramid fiber chops was 70/30.

EXAMPLE 5

There were produced the aramid fiber non-woven fabrics, the prepregs and the copper clad laminates in the same manner as those of Example 1 except that the blend ratio by weight of TECHNOLA/KEVLAR in the para-aramid fiber chops was 90/10.

EXAMPLE 6

There were produced the aramid fiber non-woven fabrics, the prepregs and the copper clad laminates in the same manner as those of Example 1 except that the blend ratio by weight of TECHNOLA/KEVLAR in the para-aramid fiber chops was 50/50 and that the fibrids of meta-aramid film (the meta-aramid fibrids) of 15 weight % was used instead of the meta-aramid fiber chops of 15 weight %. The aramid fiber now-woven fabrics were formed by the para-aramid fiber chops having the meta-aramid fibrids thermally adhered thereto.

EXAMPLE 7

There were produced the aramid fiber non-woven fabrics, the prepregs and the copper clad laminates in the same manner as those of Example 1 except that the blend ratio by weight of TECHNOLA/KEVLAR in the para-aramid fiber chops was 50/50 and that the meta-aramid fiber pulps of 15 weight % were used instead of the meta-aramid fiber chops of 15 weight %. The aramid fiber now-woven fabrics were formed by the para-aramid fiber chops having the meta-aramid fiber pulps thermally adhered thereto.

EXAMPLE 8

There were produced the aramid fiber non-woven fabrics, the prepregs and the copper clad laminates in the same manner as those of Example 1 except that there were used the para-aramid fiber chops of 60 weight % having the blend ratio by weight of TECHNOLA/KEVLAR of 50/50, the para-aramid fiber pulps of 17 weight % as auxiliary fibers, the meta-aramid fiber pulps of 15 weight % as one of binders and the thermo-setting resin binder of 8 weight % as another binder.

EXAMPLE 9

There were produced the aramid fiber non-woven fabrics, the prepregs and the copper clad laminates in the same manner as those of Example 1 except that the blend ratio by weight of TECHNOLA/KEVLAR in the para-aramid fiber chops was 50/50 and that only the thermosetting resin binder was used as the binder. The thus produced aramid fiber non-woven fabrics had the blend composition of the para-aramid fiber chops of 92 weight % and the thermosetting resin binder of 8 weight %.

EXAMPLE 10

The blend ratio by weight of TECHNOLA/KEVLAR in the para-aramid fiber chops was 50/50. The para-aramid fiber chops and the meta-aramid fibrids were dispersed in water and paper-made to form the non-woven fabrics. The non-woven fabrics were heated and pressed by passing through a pair of thermal rolls having a pressure of 200 kgf/cm and a temperature of 333° C. set.

The thus produced aramid fiber non-woven fabrics had a unit weight of 72 g/m² and the blend component of the para-aramid fiber chops of 92 weight % and the meta-aramid fibrids of 8 weight %. They were formed by the para-aramid fiber chops having the meta-aramid fibrids intertwisted therewith and thermally adhered thereto. The prepregs and the copper clad laminates were produced in the same manner as those of Example 1.

COMPARISON 1

There were produced the aramid fiber non-woven fabrics, the prepregs and the copper clad laminates in the same manner as those of Example 1 except that the blend ratio by weight of TECHNOLA/KEVLAR in the para-aramid fiber chops was 5/95.

COMPARISON 2

There were produced the aramid fiber non-woven fabrics, the prepregs and the copper clad laminates in the same manner as those of Example 1 except that the blend ratio by weight of TECHNOLA/KEVLAR in the para-aramid fiber chops was 95/5.

PRIOR ART 1

There were produced the aramid fiber non-woven fabrics, the prepregs and the copper clad laminates in the same manner as those of Example 1 except that the blend ratio by weight of TECHNOLA/KEVLAR in the para-aramid fiber chops was 100/0.

PRIOR ART 2

There were produced the aramid fiber non-woven fabrics, the prepregs and the copper clad laminates in the same manner as those of Example 1 except that the blend ratio by weight of TECHNOLA/KEVLAR in the para-aramid fiber chops was 0/100.

In order to confirm that with respect to the non-woven fabrics, the prepregs and the copper clad laminates produced by Examples 1 through 10, Comparisons 1 and 2 and Prior Arts 1 and 2, how good hole-making operation of the prepregs could be made by the laser process while it had little dispersion in hole diameter and little variation in the hole diameter and how good the printed wiring board could be produced from the copper clad laminates while there had little dispersion in size variation and little size variation, which was caused by the shrinkage of the copper clad laminate, the hole-making operation of the prepregs by the laser process and the size variation of the copper clad laminates were appreciated as defined herei[008e]jus[009f] below.

The hole-making operation of the prepregs was made by irradiating a laser light having a pulse width of 0.02 ms and a pulse period of 2 ms on the prepregs under the condition of an aperture diameter of 0.2 mm so as to make holes while they were supported just at their peripheries and did not engage anything at their lower surfaces. The diameter of the thus made holes on the side thereof where the laser light entered was measured by a length measuring instrument.

After the copper clad laminates having a size of 340 mm×510 mm were worked by etching so as to. have a predetermined wiring pattern to form a printed wiring board, holes of 0.9 mm diameter were made in the thus produced printed wiring board at their four corners and a distance a between the adjacent corner holes was measured. Then, after the printed wiring boards pass through a solder reflow apparatus having a maximum temperature of 230° C., a distance b between the adjacent corner holes was measured. The variation in the size was determined by (b–a)/a.

Tables I through III show the diameter of the holes in the prepregs measured by the length measuring instrument and the size variation of the printed wiring boards, both of which were an average value of five samples in the Examples, the Comparison and the Prior Arts, respectively.

TABLE I

| EXAMPLES | Diameter of Holes (μm) | Size Variation (%) |
| --- | --- | --- |
| 1 | 146 | −0.007 |
| 2 | 165 | −0.020 |
| 3 | 178 | −0.028 |
| 4 | 186 | −0.040 |
| 5 | 192 | −0.067 |
| 6 | 173 | −0.038 |
| 7 | 175 | −0.041 |
| 8 | 177 | −0.055 |
| 9 | 174 | −0.049 |
| 10 | 176 | −0.035 |

TABLE II

| COMPARISON | Diameter of Holes (μm) | Size Variation (%) |
| --- | --- | --- |
| 1 | 141 | −0.004 |
| 2 | 194 | −0.090 |

TABLE III

| PRIOR ART | Diameter of Holes (μm) | Size Variation (%) |
| --- | --- | --- |
| 1 | 198 | −0.100 |
| 2 | 139 | −0.001 |

FIG. 1 also shows the hole diameter measured by the length measuring instrument and the size variation of the printed wiring boards, both of which were an average value of five samples together with their dispersion or distribution. In FIG. 1, white plots indicate the size variation (%) of the printed wiring boards while black plots indicate the diameter (μm) of the holes formed by the laser process in the prepregs. Bars vertically intersecting the white plots and the black plots show the width of the dispersions in the hole diameter and the size variation.

It will be noted from FIG. 1 that with the blend ratio by weight of TECHNOLA being 10 or more and with the blend ratio by weight of KEVLAR being 90 or less, the dispersion in the hole diameter by the laser process gets smaller as shown by the shorter bars intersecting the black plots in FIG. 1. It will be also noted from FIG. 1 that with the blend ratio by weight of TECHNOLA being 90 or less and with the blend ratio by weight of KEVLAR being 10 or more,. the dispersion in the size variation of the printed wiring board due to heat gets smaller as shown by the shorter bars intersecting the white plots in FIG. 1.

Furthermore, it will be noted from FIG. 1 that with the blend ratio of TECHNOLA being 30 or more and with the blend ratio of KEVLAR being 70 or less, the dispersion in the hole diameter by the laser process gets much smaller while the dispersion in the hole diameter is closer to the set aperture diameter of 0.2 mm. It will be also noted from FIG. 1 that with the blend ratio of TECHNOLA being 70 or less and with the blend ratio of KEVLAR being 30 or more, the dispersion of the size variation of the printed wiring board due to heat gets much smaller and that the size variation itself gets smaller.

In Examples 6 through 10 in which the meta-aramid fibrids or meta-aramid fibers were used as the binder or the para-aramid fibers were used as the auxiliary fibers, it will be noted from Table 1 that the foregoing is true, which makes sure that the hole-making operation of the prepregs by the laser process was more improved and that the size variation of the printed wiring boards was more effectively printed.

It is confirmed that the hole making operation of the printed wiring board by the laser process could be more improved.

Thus, it will be understood that since the non-woven fabric of the invention comprises a principal component of para-aramid fiber chops with a blend ratio by weight % of poly-p-phenylene-diphenylether-terephthalamide fibers relative to poly-p-phenylene-terephthalamide fibers ranging from 10/90 to 90/10, the prepregs, the laminates and the printed wiring boards which include such non-woven fabrics as base materials can advantageously have smaller dispersion of the hole diameter by the laser process and also smaller dispersion of the size variation thereof as well as smaller size variation thereof.

Furthermore,- it will be understood that with the blend ratio by weight of poly-p-phenylene-diphenylether-terephthalamide fibers relative to poly-p-phenylene-terephthalamide fibers ranging from 30/70 to 70/30, the dispersion of the hole diameter by the laser process gets much smaller and the hole diameter is closer to the set aperture diameter. In addition thereto, the dispersion of the size variation of the laminates and the printed wiring boards due to heat gets much smaller and that the size variation itself gets smaller.

Although some embodiments of the invention have been described together with many Examples, some Comparisons and some Prior Arts, it will be understood by those skilled in the art that they are by way of examples, and that various changes and modifications might be made without departing from the spirit and scope of the invention, which is intended to be defined only to the appended claims.

What is claimed is:

1. An electrically insulating non-woven fabric for use in a prepreg, a laminate or a printed wiring board comprising para-aramid fiber chops bonded with each other by a binder, said non-woven fabric characterized by said para-aramid fiber chops including chops of poly-p-phenylene-diphenylether-terephthalamide fibers and poly-p-phenylene-terephthalamide fibers with a blend ratio by weight of said poly-p-phenylene-diphenylether-terephthalamide fibers relative to said poly-p-phenylene-terephthalamide fibers ranging from 30/70 to 70/30.

2. An electrically insulating non-woven fabric as set forth in claim 1, wherein said binder is a thermosetting resin binder adhered to intersections of said fibers.

3. An electrically insulating non-woven fabric as set forth in claim 1, wherein said binder is a thermoplastic resin fiber selected from the group consisting of fiber chops, fibrids, pulps and combinations thereof, having a softening temperature of 220 degrees C. or higher and bonded to said para-aramid fiber chops by at least one of the thermal adhesion and intertwinement.

4. An electrically insulating non-woven fabric as set forth in claim 1, wherein said binder includes both a thermosetting resin adhered to intersections of said fibers and a thermoplastic resin fiber selected from the group consisting of fiber chops, fibrids, pulps and combinations thereof, having a softening temperature of 220 degrees C. or higher and bonded to said para-aramid fiber chops by at least one of thermal adhesion and intertwinement.

5. An electrically insulating non-woven fabric as set forth in claim 3, wherein said thermoplastic resin fiber has a denier of 3 or leas and a fiber length of 3 to 10 mm.

6. An electrically insulating non-woven fabric as set forth in claim 4, wherein said thermoplastic resin fiber has a denier of 3 or less and a fiber length of 3 to 10 mm.

7. An electrically insulating non-woven fabric as set forth in claim 1, further comprising para-aramid fiber pulps as auxiliary fibers.

8. An electrically insulating non-woven fabric as set forth in claim 3, wherein said para-aramid fiber chop has a denier of 1.5 or less and a fiber length of 6 mm or less.

9. An electrically insulating non-woven fabric as set forth in claim 4, wherein said para-aramid fiber chop has a denier of 1.5 or less and a fiber length of 6 mm or less.

\* \* \* \* \*

UNITED STATES PATENT AND TRADEMARK OFFICE
CERTIFICATE OF CORRECTION

PATENT NO. : 6,426,310 B1
DATED : July 30, 2002
INVENTOR(S) : Shigeru Kurumatani et al.

It is certified that error appears in the above-identified patent and that said Letters Patent is hereby corrected as shown below:

<u>Title page,</u>
Item [56], U.S. PATENT DOCUMENTS, insert the following:
-- 4,729,921    3/1998           Tokarsky .............428/288 -- and FOREIGN PATENT DOCUMENTS, insert the following:
-- JP    61-160500    7/1936..................... D21H/5/20
    JP    10– 138381    5/1998..................... B32B/7/02 --

Signed and Sealed this

Eleventh Day of February, 2003

JAMES E. ROGAN
*Director of the United States Patent and Trademark Office*